(12) United States Patent
Haramein

(10) Patent No.: US 9,834,862 B2
(45) Date of Patent: *Dec. 5, 2017

(54) PRECISION CUT HIGH ENERGY CRYSTALS

(71) Applicant: TORUS TECH LLC, San Clemente, CA (US)

(72) Inventor: Nassim Haramein, Carslbad, CA (US)

(73) Assignee: Ark Crystal, LLC, San Clemente, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 14/640,146

(22) Filed: Mar. 6, 2015

(65) Prior Publication Data

US 2016/0090666 A1    Mar. 31, 2016

Related U.S. Application Data

(60) Provisional application No. 62/055,503, filed on Sep. 25, 2014.

(51) Int. Cl.
*C30B 29/18* (2006.01)
*C01B 33/113* (2006.01)
*C03B 20/00* (2006.01)

(52) U.S. Cl.
CPC ............ *C30B 29/18* (2013.01); *C01B 33/113* (2013.01); *C03B 20/00* (2013.01)

(58) Field of Classification Search
CPC ......... C30B 33/00; C30B 29/18; C30B 33/06; Y10T 428/29
USPC ....................................................... 428/357
See application file for complete search history.

(56) References Cited

U.S. PATENT DOCUMENTS

| 2,460,703 | A | 2/1949 | Mason |
| 2,460,704 | A | 2/1949 | Mason |
| 4,109,359 | A | 8/1978 | Cross et al. |
| 5,514,904 | A | 5/1996 | Onga et al. |
| 7,611,732 | B2 | 11/2009 | Bentley |
| 8,088,057 | B2 | 1/2012 | Honeycutt et al. |
| 9,435,054 | B1* | 9/2016 | Haramein ............... C30B 29/18 |
| 2008/0001679 | A1 | 1/2008 | Kerpert et al. |
| 2008/0223713 | A1 | 9/2008 | Xu et al. |
| 2011/0304406 | A1 | 12/2011 | Yasuike |
| 2013/0058870 | A1 | 3/2013 | Lacroix et al. |
| 2015/0093571 | A1* | 4/2015 | Haramein ............... C30B 33/00 428/357 |

FOREIGN PATENT DOCUMENTS

| CN | 101498031 B | 6/2011 |
| EP | 0164836 | 12/1985 |
| EP | 0353845 A1 | 2/1990 |
| EP | 2051374 A1 | 4/2009 |
| GB | 2403024 | 12/2004 |
| JP | 09132500 A | 5/1997 |
| JP | 2844948 | 1/1999 |
| JP | 2001144578 | 5/2001 |

OTHER PUBLICATIONS

"Clear Quartz Platonic Solids Set Carving Crystal Healing Sacred Geometry NR!", ebay, http://www.ebay.com/itm/Error?item=Clear-Quartz-PLATONIC-SOLIDS-SET-Carvi&errid=5, screen capture May 1, 2013.
Master Crystals, www.matercrystals.com.
"Quartz Structure", The Quartz Page, www.quartzpage.de/gen_struc.html, screen capture May 1, 2013.
Tree of Life Tech, www.treeoflifetech.com.
Vogel Crystals, www.vogelcrystals.net.
"Vogel Crystals Explained", Crystal Vaults, http://www.ebay.com/itm/Error?item=Clear-Quartz-PLATONIC-SOLIDS-SET-Carvi&errid=5, screen capture May 1, 2013.
"Vogel Crystals", Karin Kabalah Center, http://www.karinkabalahcenter.com/vogel-crystals/, screen capture May 1, 2013.

* cited by examiner

*Primary Examiner* — Leszek Kiliman
(74) *Attorney, Agent, or Firm* — Fish IP Law, LLC

(57) ABSTRACT

Crystals having a modified regular tetrahedron shape are provided. Crystals preferably have four substantially identical triangular faces that define four truncated vertices and six chamfered edges. The six chamfered edges can have an average length of l, and an average width of w, and $8 \leq l/w \leq 9.5$.

9 Claims, 1 Drawing Sheet

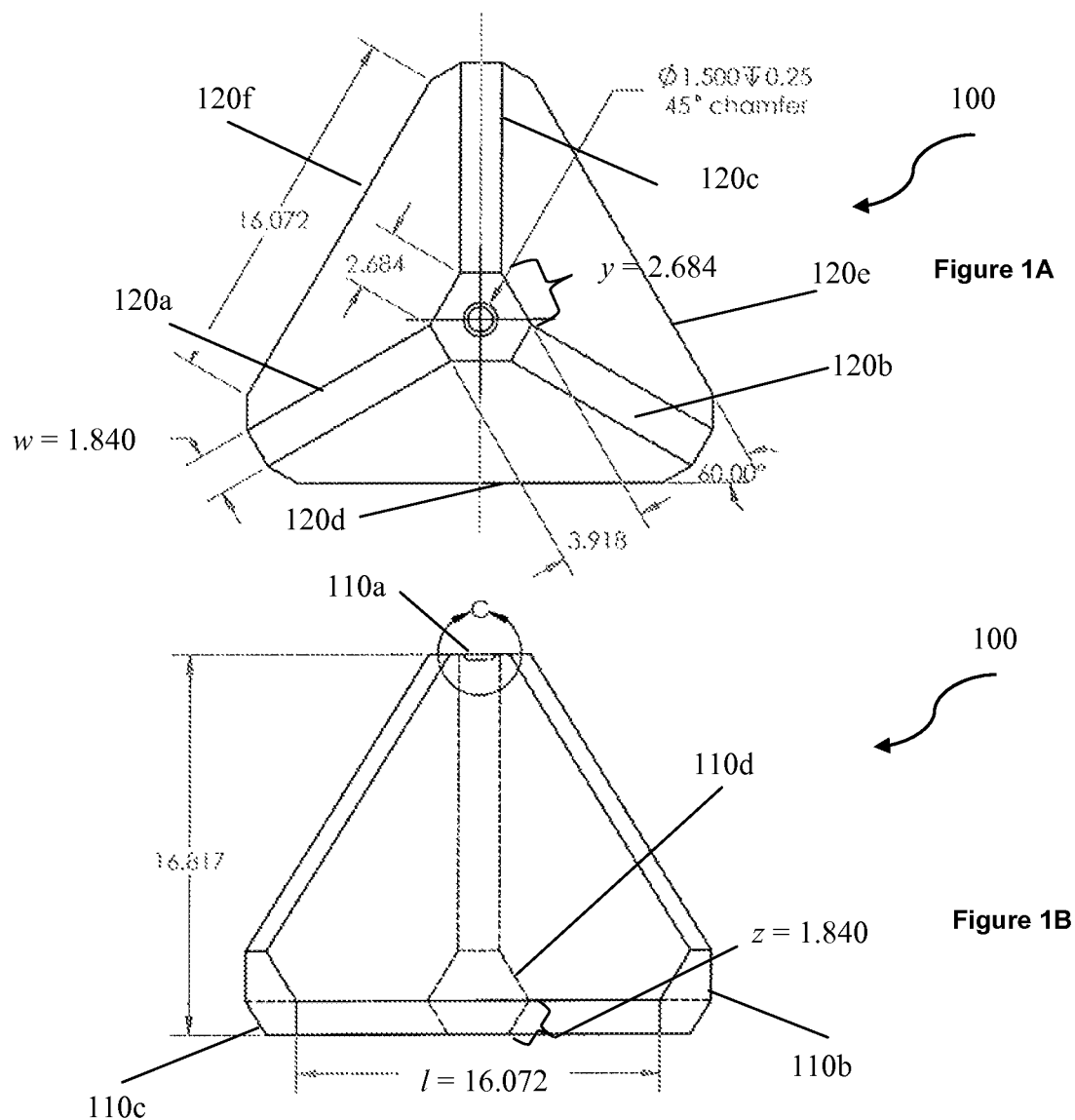

PRECISION CUT HIGH ENERGY CRYSTALS

This application claims priority to U.S. Provisional Application No. 62/055,503, filed on Sep. 25, 2014. This and all other publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

FIELD OF THE INVENTION

The field of the invention is crystal technology.

BACKGROUND

The background description includes information that may be useful in understanding the present invention. It is not an admission that any of the information provided herein is prior art or relevant to the presently claimed invention, or that any publication specifically or implicitly referenced is prior art.

One problem with known quartz crystals is that the edges can be sharp and, if dropped, are prone to breakage. Masters' Crystals™ discloses a "Coherence Crystal Tetrahedron." (http://masterscrystals.com/crystal-shopping/coherence/coherence-crystal-<get). The Coherence Crystal tetrahedron is composed of lab grown quartz, and is cut and polished to have beveled edges "for comfortable handling and less chance of breakage if accidentally dropped." Unfortunately, Masters' Crystals crystal tetrahedrons apparently do not have the dimensions and materials that allow a user to experience optimal mental, emotional and focusing effects.

There has been a long felt need to improve energetic and vibrational healing therapies using gemstones. Tree of Life Tech™ discloses quartz crystals named Vogel Crystals™, which appear to be filled with platinum, gold, therapeutic gems, mineral, and other homeopathic ingredients under the theory that the homeopathic ingredients will be put into resonance with the body when placed into wells drilled into the Vogel Crystals and capped with gold. Unfortunately, there remains a need for unfilled crystals capable of forming resonances with frequencies.

Thus, there is still a need for crystals that can "ring" when brought into harmonic resonance with acoustic, electromechanical, and electromagnetic radiation, wherein the frequencies of these resonances can be tuned by refining the size and shape of the crystal.

SUMMARY OF THE INVENTION

The inventive subject matter provides compositions and methods in which a piezoelectric hydrothermally grown synthetic quartz crystal is precision cut to form a tetrahedron that is perfectly aligned with the molecular structure of the quartz crystal.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

In some aspects of the inventive subject matter, a crystal can have a shape that is modified from a regular tetrahedral shape. The modified tetrahedral shape has four identical or substantially identical triangular faces joined at four truncated vertices and six chamfered edges. The six chamfered edges have an average length of l, and an average width of w; wherein $8 \leq l/w \leq 9.5$ (most preferably 8.735). As used herein the term "substantially identical" means identical within 2% along each dimension.

The size and shape of the crystal at least partially determines the harmonic resonances at which the inventive subject matter "rings" (or resonates). Such harmonics may be acoustic, electromechanical, or electromagnetic. The tetrahedral shape will tend to oscillate or resonate across the height of the truncated crystal, across the diameter of the tetrahedral insphere, and with the upper and lower harmonics thereof. In addition, the presence of the sum and difference frequencies of these two will occur. In some contemplated embodiments of the inventive subject matter, the fundamental height resonance frequency is between 335 and 345 kHz, most preferably 340.135 kHz, the fundamental insphere resonance frequency is between 560 and 570 kHz, most preferably 567.386 kHz, and the harmonics are at integer multiples and divisors of the fundamental resonance frequencies (e.g., 1, 2, 3, 4, 5, and so forth). Viewed from a different perspective, there will be a spectral spread in a roughly Poisson distribution, below the fundamental, the fundamental being the upper limit.

Experiments have shown that if the crystal is cut with dimensions or materials other than those provided herein, the ringing is absent or greatly muted (e.g., muted by greater than 25%, greater than 33%, great than 50%, greater than 75% or even greater than 90%). Additionally, crystals that are sized and cut in accordance with the inventive subject matter to have a refractive index of exactly or approximately 1.54421 (e.g., electromagnetic radiation travels 1.54-1.55 times slower than in a vacuum) have interactions between the electromechanical resonance and the electromagnetic resonance that are enhanced at certain harmonics. This property is believed to give or contribute to the mental, emotional and focusing effects claimed by experimental users of some crystals of the inventive subject matter. A purpose of the inventive subject matter is to provide a crystal that resonates with water (whose molecules are tetrahedral) and living things (whose cells are filled with water).

It is contemplated that a crystal of the inventive subject matter can comprise faces having a surface roughness $\leq 20$ Angstroms RMS, more preferably $\leq 15$ Angstroms RMS, and even more preferably $\leq 5$ Angstroms RMS. Additional characteristics of some crystals of the inventive subject matter can be found in Applicant's U.S. Provisional Application No. 62/055,503, which is incorporated herein in its entirety. It should be appreciated that the disclosure provided in the '503 application is directed to specific embodiments, and should not be interpreted as limiting the scope of the inventive subject matter provided herein.

In some preferred embodiments, the lengths of each of the six chamfered edges, l, are substantially identical. As described above, the term "substantially identical" means having dimensions that differ by 2% or less. In some contemplated embodiments, the lengths of the six edges differ by no more than 0.1%.

Additionally or alternatively, some crystals of the inventive subject matter can comprise chamfered edges having widths, w, that differ by no more than 2%, or even no more than 0.1% of any other chamfered edge width.

The ratio of a chamfered edge's length to width preferably is between 8:1 and 9:1. In contemplated embodiments, 8.3≤l/w≤9.2, more preferably and 8.7≤l/w≤8.8. In yet further embodiments, l/w will equal 8.7348, or even 8.734782608.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

In other aspects of the inventive subject matter, the truncated vertices are preferably exactly parallel (or at least within 1 degree, more preferably within at least 0.5 degree, and even more preferably within 0.1 degree of parallel) to at least one of the four substantially identical triangular faces. Additionally, each of the four truncated vertices may be hexagonal, having three edges with substantially identical lengths, y and three edges with substantially identical lengths, z. Where three edges having substantially identical lengths are not identical, it is contemplated that the lengths (y or z) is a mean of the three edges. The length of the vertex edges, y, divided by the width of the chamfered edges w may vary such that 1.3≤y/w≤1.7, and more preferably 1.4≤y/w≤1.6, and even more preferably y/w=1.458-1.459. The length of the vertex edges, z, divided by the width of the chamfered edges w may vary such that 0.8≤z/w≤1.2. Viewed from a different perspective, z/w may equal 1±2%, more preferably 1.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWING

FIG. 1A is a top view illustration of a crystal of the inventive subject matter.

FIG. 1B is a side view illustration of a crystal of the inventive subject matter.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

The inventive subject matter provides compositions and methods in which a piezoelectric hydrothermally grown synthetic quartz crystal is precision cut to form a tetrahedron that is perfectly aligned with the molecular structure of the quartz crystal along the z (or c) and x+ axes. The quartz should be crystalline and include no fused or amorphous silica ($SiO_2$) (or substantially no fused or amorphous silica ($SiO_2$)). Viewed from a different perspective, the alignment is preferably within one degree of the arc in both the z and x+ axes.

Crystals of the inventive subject matter are preferably cut to accord with geometric equations. In preferred embodiments, the uncut edge of the starting tetrahedron is derived from the geometric mean between the proton and the Planck radii and applied to the proton to crystal uncut tetrahedron edge, giving an uncut edge constant (root value) of e=26.9610 mm and giving h, height, by geometric derivation $h=e\sqrt{2/3}$. Therefore the uncut height of the tetrahedron h (where the root value is 26.9610 mm)=22.0136 mm. Additionally or alternatively, the cut $a_c$ of each of the 4 apices is defined $$a_c = h\left(\frac{1}{\varphi}\right)^3 m$$

where phi, $$\varphi = \frac{(\sqrt{5}+1)}{2},$$

is the "golden ratio." The chamfers of the edges are defined as:

$$c_e = \frac{h}{2} \times \frac{e}{h} \times \left(\frac{1}{\varphi}\right)^6 \times \left(1 - \left(\frac{1}{\varphi}\right)^3\right).$$

One skilled in the art will appreciate that the golden ratio, φ is related to the Fibonacci series and any number in the series, n, can be calculated using the equation:

$$F_{(n)} = \frac{\varphi^n - (-\varphi)^{-n}}{\sqrt{5}}.$$

In some preferred embodiments, crystals are cut from a precisely lattice-oriented block of extremely pure, synthetically grown $SiO_2$ lumbered hydrothermal optical quality quartz. It is contemplated that some crystals of the inventive subject matter can be right-handed quartz crystals. It is also contemplated that multiple crystals can be cut from a single synthetic quartz bar. For example, 25 crystals can be produced from 25 pieces of 20 mm×20 mm×20 mm synthetic quartz that are cut from a quartz bar that is 76.1-76.3 mm in length, 240-265 mm in width, and 23-23.3 mm in depth. As another example, crystals can be produced from a synthetic quartz bar having the following dimensions 88.0±0.1 mm (x) by 30.0±0.2 mm (z) by 240 mm or more (y), and have an infrared Q value (precision of oscillation in the electrical domain) of at least 3 million.

The crystals are preferably cut in a manner such that no fused or amorphous $SiO_2$ is used or created by any procedure in the manufacturing process as fused quartz becomes amorphous and cannot behave in the electrical or energy domains in the same way as pure synthetic crystalline quartz.

Viewed from a different perspective, crystals are preferably cut such that no more than two molecular layers of material may be fused at any cutting plane or edge in the final product. This can be achieved where the cutting and polishing process does not heat the crystal in near or in excess of 573° C., which is transition temperature to fused quartz. Therefore, crystals of the inventive subject matter are preferably cut from pure synthetic crystalline block, and excessive heating is avoided during the manufacturing process.

FIGS. 1A-1B show top and side view illustrations of a crystal of the inventive subject matter that is cut in accordance with the aforementioned equations. It should be noted that crystals cut according to the equations of the inventive subject matter could be based on any suitable root number, and such root number is not limited to 26.9610 mm.

As shown in FIGS. 1A-1B, a crystal 100 of the inventive subject matter includes four truncated vertices 110a, 110b, 110c and 110d, and six chamfered edges 120a, 120b, 120c, 120d, 120e and 120f. In the embodiment shown, each of the truncated vertices are six sided, wherein three sides have a first length of 2.684 mm±0.2 mm, and wherein the remaining three sides have a second length of 1.840 mm±0.2 mm. Preferably the sides of the truncated vertices alternate between the first length and the second length, and a distance from an end of a first side to an end of a second adjacent side is 3.918 mm±0.2 mm. Each of the six chamfered edges is rectangular in shape and dimensioned as 16.072 mm±0.2 mm by 1.840 mm±0.2 mm.

Crystal 100 could result from a crystal having an uncut edge or root value of, for example, 26.9610 mm, and an uncut height of 22.0136 mm±0.2 mm, wherein the crystal is cut in accordance with the following:

h, height, by geometric derivation $h=e\sqrt{2/3}$.

Additionally,

The cut or truncation $a_c$ of each of the 4 apices/vertices is defined $$a_c = h\left(\frac{1}{\varphi}\right)^3 m$$

where phi, $$\varphi = \frac{(\sqrt{5}+1)}{2},$$

is the "golden ratio."

The chamfer of the edges is defined as:

$$c_e = \frac{h}{2} \times \frac{e}{h} \times \left(\frac{1}{\varphi}\right)^6 \times \left(1 - \left(\frac{1}{\varphi}\right)^3\right).$$

One skilled in the art will appreciate that the golden ratio, $\varphi$, is related to the Fibonacci series and any number in the series, n, can be calculated using the equation:

$$F_{(n)} = \frac{\varphi^n - (-\varphi)^{-n}}{\sqrt{5}}.$$

The finished height of such cut crystal would be 16.817 mm±0.2 mm.

While the above example is representative of a crystal cut in accordance with the above equations presuming a root value of 26.9610 mm, it should be appreciated that alternative crystals of the inventive subject matter could be cut in accordance with the above equations, but using a different root number (e.g., 20 mm (smaller root value), 34 mm (larger root value)). Any suitable root value could be used in combination with the above equations to obtain an appropriate height, cut and chamfer to provide the "ring" or resonance desired.

In some embodiments of the inventive subject matter, a crystal cut in accordance with the equations described herein, and having a root value of 26.9610 mm will have the following finished tolerances:

Tolerance of
  diameter and thickness: ±0.050 mm
  (W±0.1 mm)×(H±0.1 mm)×(L+0.5/−0.1 mm)(L≥2.5 mm)
  (W±0.1 mm)×(H±0.1 mm)×(L+0.1/−0.1 mm)(L<2.5 mm)
Flatness values are Peak-to-Valley=λ/4, where λ=633 nm.
Angle Tolerance: Δθ≤0.1° Δφ≤0.1°.
Clear Aperture 90% of central area.
Damage Threshold [GW/cm$^2$]>0.5 for 1064 nm, TEM00, 10 ns, 10 Hz (AR–coated)>0.3 for 532 nm, TEM00, 10 ns, 10 Hz (AR–coated).
Wavefront Distortion<λ/8@633 nm.
Interior Quality—No visible scattering paths or centers [inspected by 50 mW green laser]
Measurements are NIST certified.
Parallelism is typically 4 arc minutes or better on initial samples.
Scratch-dig is typically 80-50 on initial samples, but may not be guaranteed.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A crystal having a modified regular tetrahedral shape, comprising:
  a crystalline composition comprising a synthetic quartz;
  four substantially identical faces, four truncated vertices, and six chamfered edges;
  wherein each of the truncated vertices have six sides, and wherein a length of a first side of the six sides and a length of an adjacent second side of the six sides has a ratio of between 1.3:1 and 1.7:1.

2. The crystal of claim 1, wherein the composition essentially consists of the synthetic quartz.

3. The crystal of claim 1, wherein each of the faces has a surface roughness ≤10 Angstroms RMS.

4. The crystal of claim 1, wherein a length of each of the six edges differ by no more than 1%.

5. The crystal of claim 1, wherein a width of each of the six edges differ by no more than 1%.

6. The crystal of claim 4, wherein the width of each of the six edges differ by no more than 1%.

7. The crystal of claim 1, wherein the first side has the length of 1.840 mm±0.2 mm.

8. The crystal of claim 1, wherein each of the six chamfered edges is rectangular and has a length to width ratio of between 8 and 9.5, inclusive.

9. The crystal of claim 1, wherein each of the four truncated vertices are parallel to at least one of the four substantially identical triangular faces.

* * * * *